United States Patent [19]

Whelan

[11] 4,293,249
[45] Oct. 6, 1981

[54] MATERIAL HANDLING SYSTEM AND METHOD FOR MANUFACTURING LINE

[75] Inventor: Paul L. Whelan, Dallas, Tex.

[73] Assignee: Texas Instruments Incorporated, Dallas, Tex.

[21] Appl. No.: 126,597

[22] Filed: Mar. 3, 1980

[51] Int. Cl.³ ............................................. B65G 51/02
[52] U.S. Cl. ...................................... 406/72; 406/88; 414/217
[58] Field of Search ................. 406/72, 85, 88, 28, 406/19, 21, 52, 62, 63; 414/217, 222; 118/62, 715, 719, 728, 729, 730, 732, 733

[56] References Cited

U.S. PATENT DOCUMENTS

| | | | |
|---|---|---|---|
| 3,584,847 | 6/1971 | Hammond, Jr. et al. | 118/733 X |
| 3,721,210 | 3/1973 | Helms et al. | 118/730 X |
| 3,874,525 | 4/1975 | Hassan et al. | 118/733 X |

*Primary Examiner*—Jeffrey V. Nase
*Attorney, Agent, or Firm*—Rene' E. Grossman; Melvin Sharp; James T. Comfort

[57] ABSTRACT

Disclosed for use in a manufacturing line is a material handling system which can be utilized for electronic component manufacturing, such as semiconductor slices, at subatmospheric conditions. The articles to be subjected to various manufacturing steps are moved serially on a track of gas or air. At a work station which requires a manufacturing operation to be performed at subatmospheric conditions, e.g., a vacuum, the article is initially loaded into an input air lock which incorporates a magazine loader capable of storing and conveying such articles into a manufacturing processing station operating at subatmospheric conditions. Once the input air lock system is loaded, the entrance gate to such air lock is closed and the air lock system is evacuated to match the subatmospheric pressure of the manufacturing processing work station. When the pressures are matched, an exit gate in the input air lock system opens and a slidable air track located in an interim chamber is coupled with the interior of the manufacturing station. Pulses of compressed gas are utilized to transfer the articles from the input air lock, through the interim chamber to the manufacturing processing station. The articles are then processed in such station. At the conclusion of the manufacturing step, the articles are unloaded and transferred through an output interim chamber to an output air lock which is at the same subatmospheric pressure as the manufacturing processing work station. The articles are transferred from such work station using pulses of compressed gas until the output air lock is fully loaded. When fully loaded, the exit gate associated with said output air lock is closed and the output air lock is raised to atmospheric pressure. The articles are unloaded for further processing or disposition.

29 Claims, 8 Drawing Figures

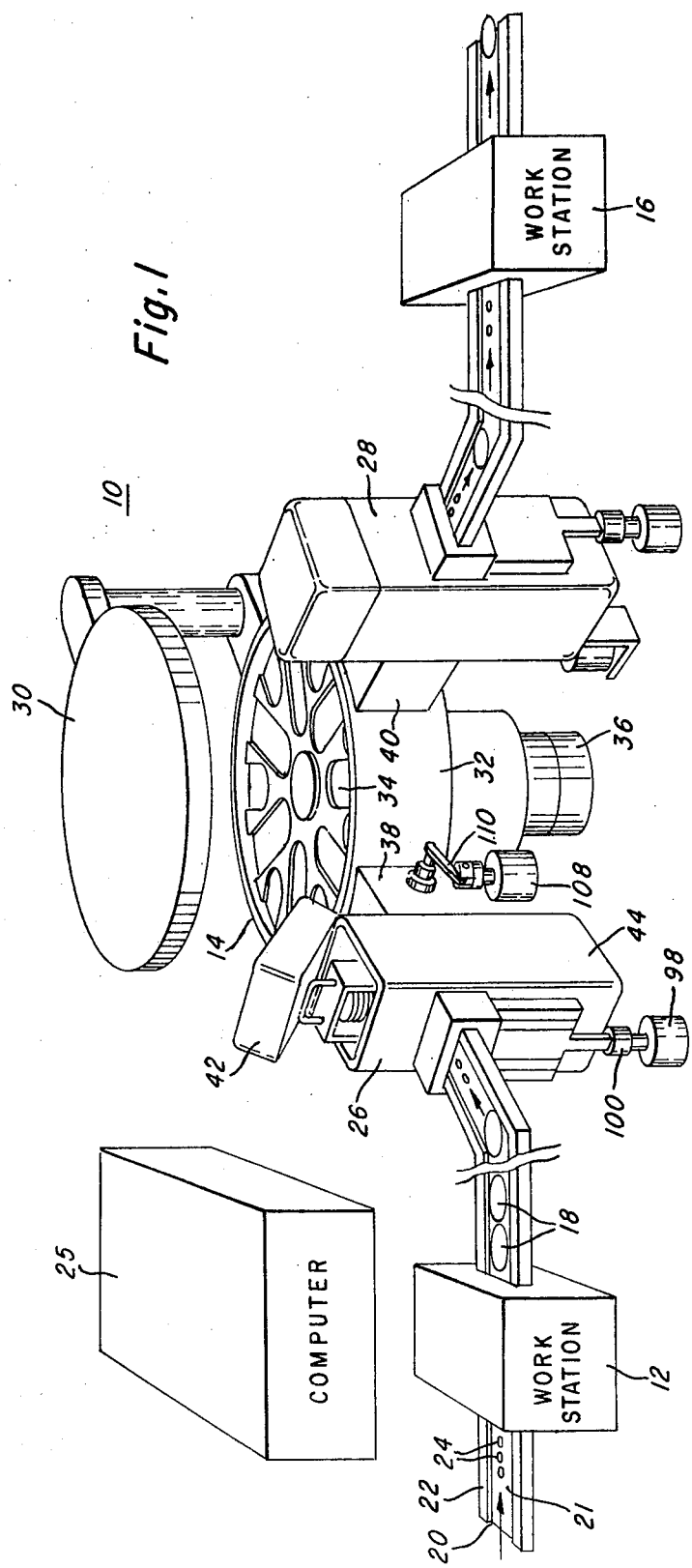

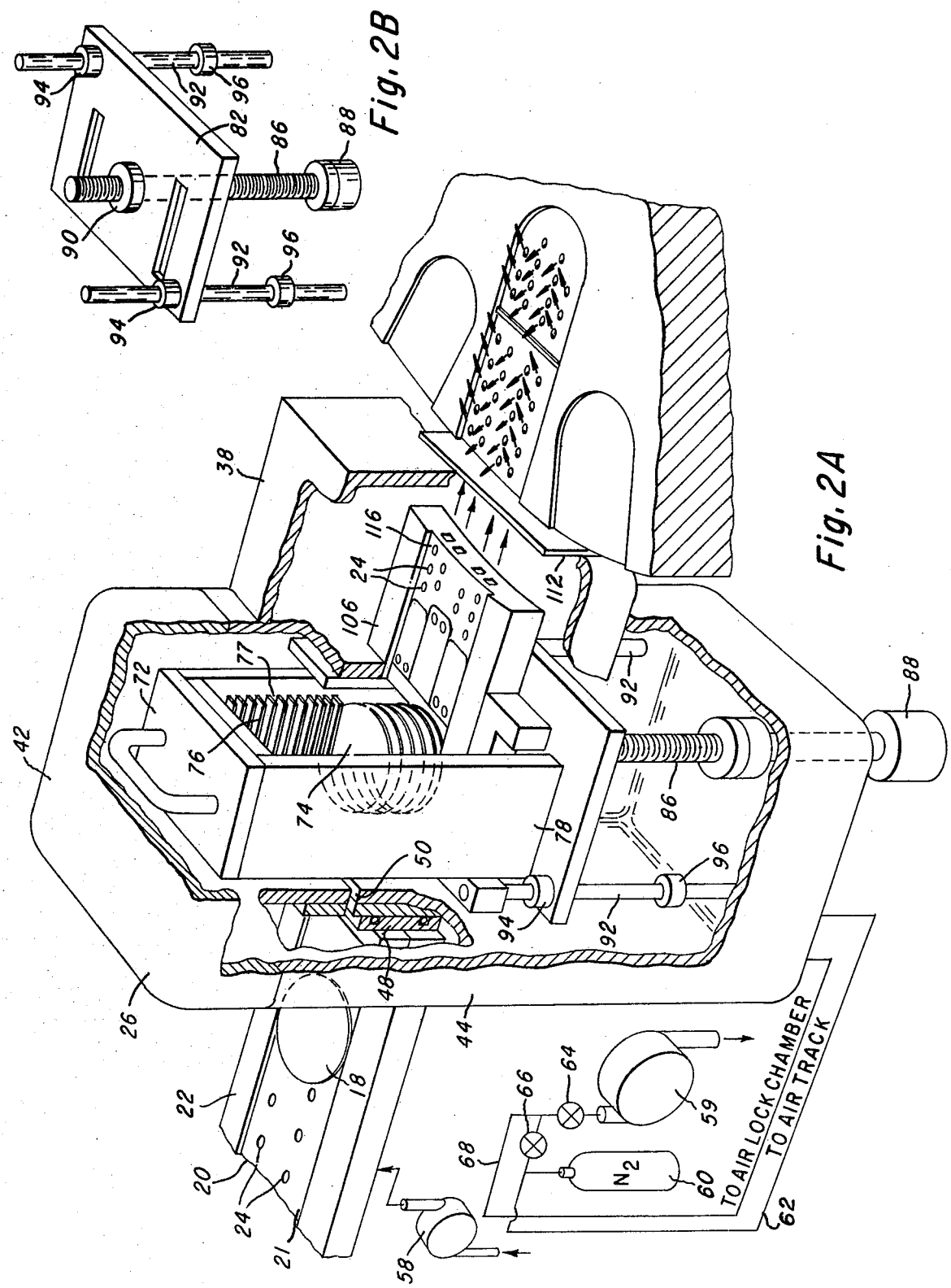

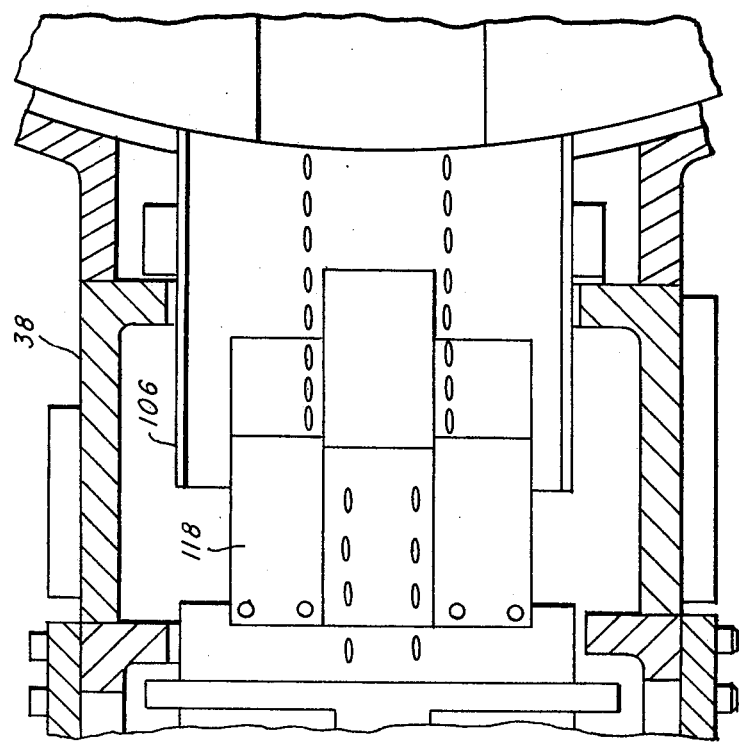

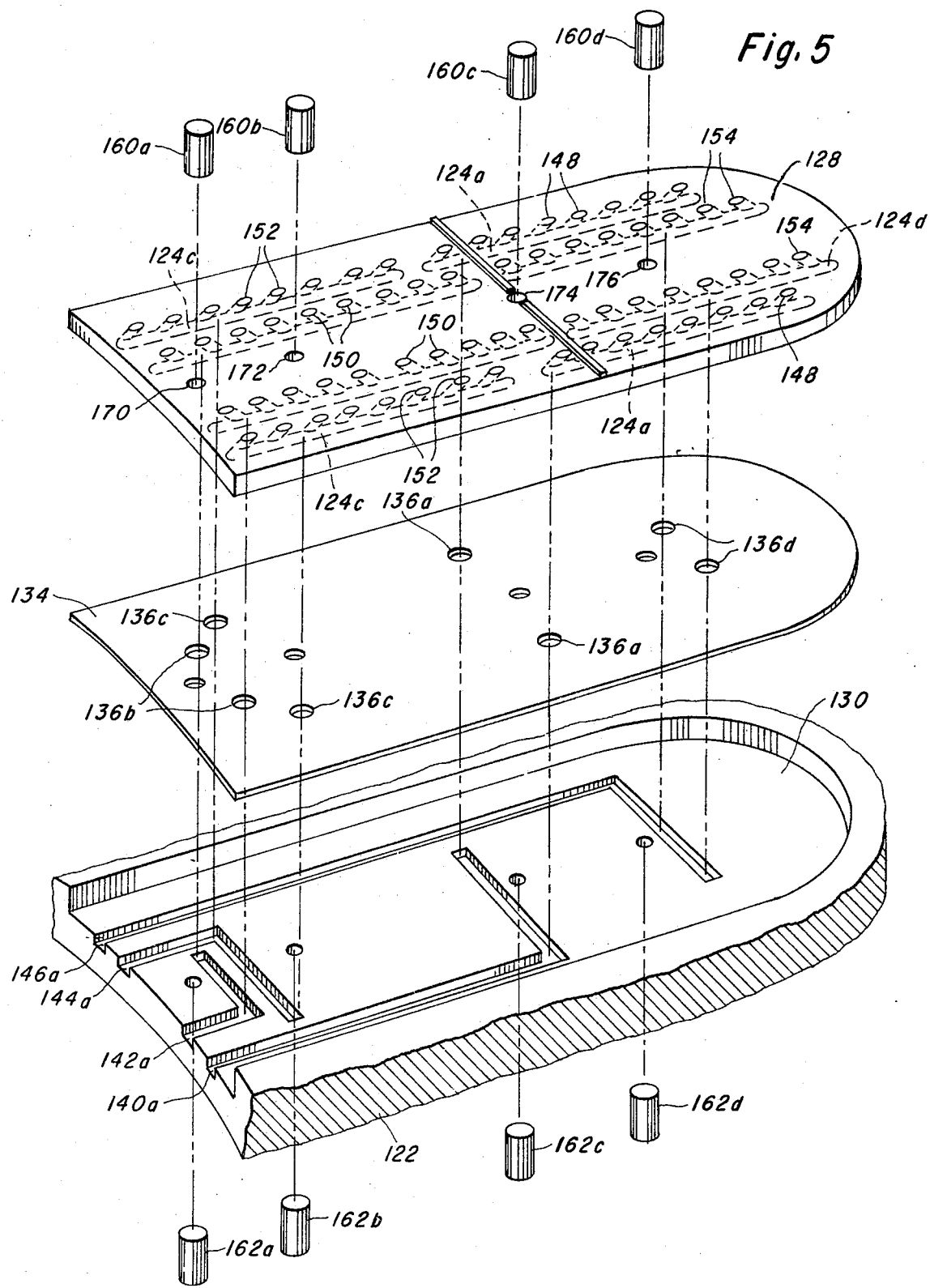

MATERIAL HANDLING SYSTEM AND METHOD FOR MANUFACTURING LINE

This invention relates to material handling systems and methods for a manufacturing line and more particularly to a transporting and positioning system and method capable of operation at subatmospheric pressures.

In manufacturing electronic components, semiconductor products (slices) are transported in a serial fashion between a plurality of work stations. As the slices move through the manufacturing line, each work station performs a separate manufacturing operation on each slice in order to attempt to process the slices rapidly and to prevent slice accumulation between work stations. Typical of such systems is the automatic slice processing system described in U.S. Pat. No. 3,765,763 entitled Automatic Slice Processing. This system operates at atmospheric conditions and the slices are conveyed on a cushion of compressed gas or air, hereinafter referred to as an "air" track system (regardless of the particular gas that is used to convey the slices). The slices to be transported are extremely thin and fragile, each slice being approximately one to four inches in diameter and approximately 20 mils in thickness. In addition to being very thin and easily broken, each semiconductor slice must be carefully handled to ensure that all but the edges of the major surfaces of the slices remain undamaged during device fabrication. The slice surfaces must also remain clean throughout the fabrication of the individual devices. Some mechanical equipment has been devised to store and transport semiconductor slices such as that disclosed in U.S. Pat. No. 3,507,382 entitled Semiconductor Slice Storage and Conveyor System. However mechanical transport systems create particle contamination in the processing stage through friction of the parts which is undesirable.

Present semiconductor processing requires manufacturing operations which occur at subatmospheric pressures, some less than 1.0 torr ((1.0 torr=1.0 mm mercury=0.019PSIA). One such manufacturing operation utilizes plasma reactors which provide reactive plasma deposition and etching of high quality dielectric films on semiconductor substrates during the manufacturing of such semiconductor slices. These plasma reactor systems are capable of operating at such subatmospheric pressures (less than 1.0 torr, for example) and at temperatures above 300 C. However, using such a plasma reactor system at subatmospheric pressures in a manufacturing system (such as that disclosed in U.S. Pat. No. 3,765,763 referenced above) creates a problem in that the manufacturing system described can transport a workpiece or slice and perform a manufacturing operation only at atmospheric pressure. Therefore, to utilize a plasma reactor system as one of the work stations would require bringing the plasma reactor work station to atmospheric pressure. An operator would then use manual techniques, such as gripping the slices with tweezers (which frequently results in a broken slice) or utilizing a vacuum pencil or other vacuum device which must contact the working portion of the slice surface (which also causes surface damage) to load the inner chamber of the plasma reactor work station. Such manual loading of the reactor work station creates problems and disadvantages. One such disadvantage, as mentioned previously, is damage to the slice itself; such manual handling also is slow and therefore reduces the throughput of the manufacturing line. Another factor which reduces the throughput of the manufacturing line is that the plasma reactor system must be brought to atmospheric pressure, opened, loaded, evacuated back to a subatmospheric pressure and then brought back to atmospheric in order to unload. This cycling of the pressure from the reactor's subatmospheric pressure back to atmospheric and then back to subatmospheric pressure in order to process the slices again takes a substantial amount of time, thereby reducing the slice throughput through the manufacturing line. Additionally, when bringing the reactor chamber back to atmospheric pressure in order to manually load the chamber and exposing it to the atmosphere, contaminants are introduced into the plasma reactor chamber which affect the manufacturing operation of the semiconductor slice. Therefore it is desirable to design a system wherein the work station or plasma reactor chamber is never exposed to atmospheric pressure. ET Systems manufactures a Model 4200 Plasma Reactor System which includes a plasma reactor system in combination with an air lock. A mechanical slice transport pivot arm, pivoting inside the air lock, loads and unloads the reactor, one slice at a time. LFE Inc. produces a Model 8000 Plasma Reactor which utilizes an air lock and loads and unloads the reactor with a linear vibrator. Other work stations, such as the AMT Model AVD, utilize an air lock in conjunction with a gravity and shaker feed. These systems all have the disadvantage of loading slices one at a time and the mechanical transport systems create particle contamination in the processing stage.

Heretofore designers veered away from an air track-type system for transporting articles at subatmospheric pressure to different manufacturing processing stations. Designers were not aware that an air track could be used in an environment at extremely low pressures, such as below 10 torr pressure. Also, in a low pressure environment, once the work piece or slice begins moving, it has a tendency to accelerate and therefore is difficult to control. Another problem created by working in a subatmospheric environment is devising a means for stopping the article. At very low pressures, a vacuum brake, such as that described in U.S. Pat. Nos. 3,717,381; 3,976,329; 3,797,889 and 3,890,508 would be ineffective to stop the work piece movement.

Therefore, it is an object of the present invention to provide a method and apparatus for transporting articles continuously and automatically through a manufacturing line without manual intervention.

Another object of the present invention is to provide a method and apparatus for transferring articles into and out of a subatmospheric manufacturing processing station without exposing said station to atmospheric pressures.

Another object of the present invention is to provide a method and apparatus for reducing contaminants introduced at a manufacturing processing station.

Another object of the present invention is to provide a method and apparatus for stopping the motion of an article in a controlled manner in a subatmospheric environment.

Still another object of the present invention is to provide a method and system for transporting articles continuously and automatically, thereby eliminating intermediate manual handling, to facilitate manufacture of articles, such as electronic components, at reduced cost and increased speed of manufacture.

Other objects and features of the invention will become more readily understood from the following detailed description and appended claims when read in conjunction with the accompanying drawings, in which like reference numerals designate like parts throughout the figures thereof, and in which:

FIG. 1 is a perspective view of a material handling system according to the present invention.

FIG. 2A is a cutaway perspective view of an air lock and interim chamber.

FIG. 2B is a perspective view of the support plate and drive mechanism for the magazine loader utilized in the air lock.

FIG. 3B is a plan view of the slidable air track in its extended position.

FIG. 5 is an expanded view of the substrate holder table.

Figure 2C:
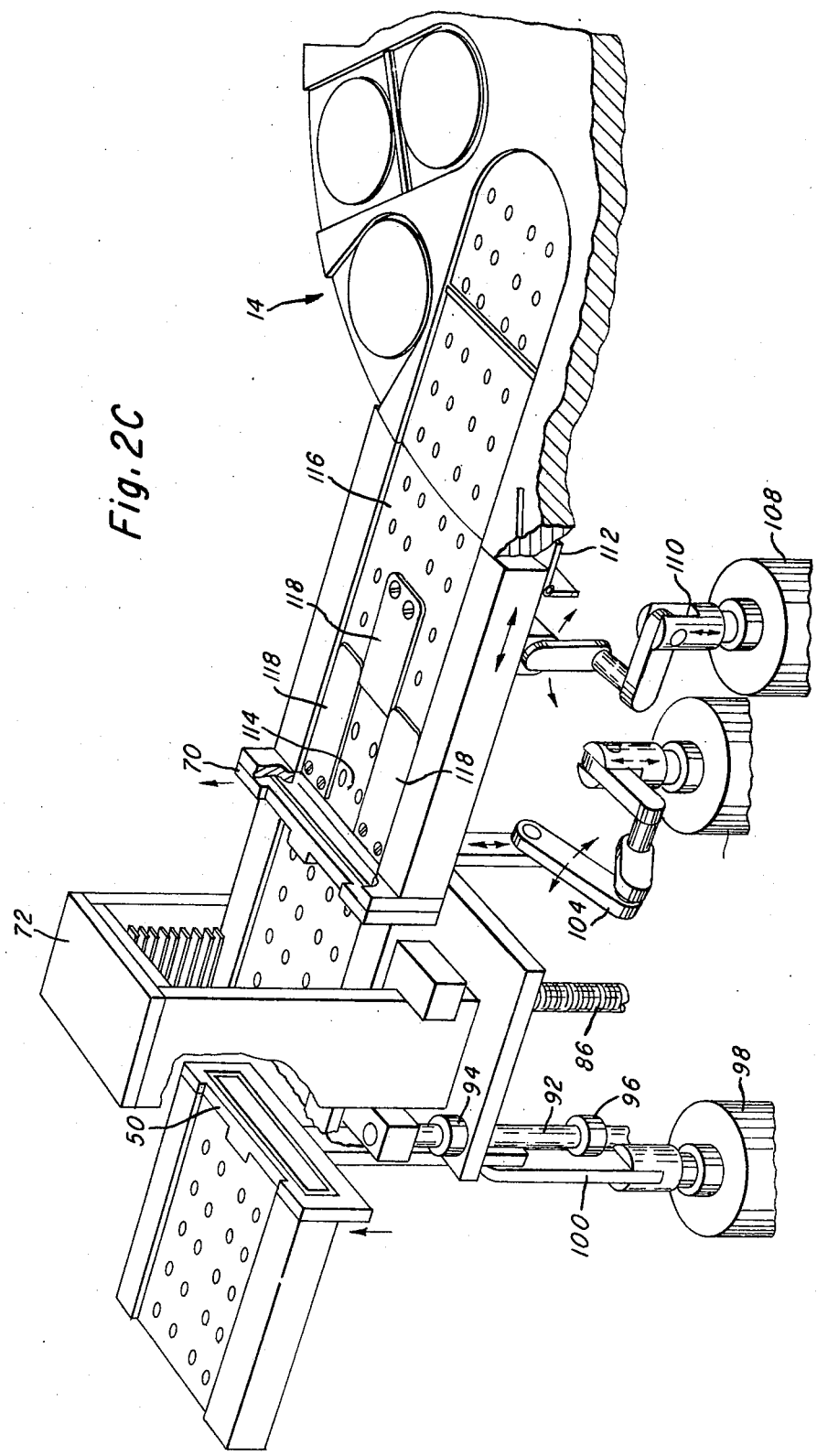
FIG. 2C is a perspective view of the air lock and interim chamber with the slidable air track in its extended position.

Referring now to FIG. 1, a manufacturing line 10 is disclosed according to the present invention. The manufacturing line 10 is comprised of a plurality of independent work stations 12, 14, 16, each of which is interconnected in a serial manner by a transporting system. Any article which is to be subjected to multiple manufacturing steps and subatmospheric conditions can utilize the present invention, but for purposes of illustration, the invention will be described for use in manufacturing semiconductor products or slices 18. Slices 18 are transported by a slice transporting air (or gas) track 20 which basically is comprised of a guideway 22 having a line of small diameter, angularly directed holes 24 formed in floor member 21. A compressed gas (air) source (not shown) forces compressed air through holes 24 in floor member 21 to form jets of compressed air above the surface of the guideway. The jets support slices 18 on a cushion of air and propel the slices along the guideway throughout the manufacturing line. A conventional air track transport system is disclosed in U.S. Pat. No. 3,717,381.

Computer 25 is connected to the slice transporting portion of the system and operates to regulate movement of slices to and from each of the work stations of the system. The work stations in the system are mechanically, electrically and chemically self contained. The timing, sequencing and control systems which are performed by the computer regulate the initiation, progress and termination of every operation performed by each of the work stations in the system. The computer can be reprogrammed easily such that the manufacturing processes performed by the manufacturing line can be conveniently altered. A computer suitable for use in the present invention is a model TI990 computer manufactured and sold by Texas Instruments Incorporated, Dallas, Tex.

Work station 14 operates at subatmospheric pressures and for purposes of illustration is shown as a plasma reactor work station. Plasma reactors perform reactive plasma deposition and etching of high quality dielectric films on semiconductor substrates during the manufacture thereof. These plasma reactors operate at pressures less than one torr and at temperatures as high as 300° C. Accordingly, a wide variation of temperatures and subatmosphere pressures can be achieved in plasma reactor 14.

Plasma reactor work station 14 is comprised of two separate sections, an upper reactor lid 30 and a lower reactor section 32. Inside lower section 32 is a substrate holder 34 configured so as to hold a maximum of 21 semiconductor slices for processing. Coupled (not shown) to lower reactor section 32 is a drive shaft which is connected to motor 36. Motor 36 rotates 360° in order to load and unload slices into and out of substrate holder 34. An entrance interim chamber 38 is configured between the storage means or entrance air lock 26 and the lower section 32 of reactor work station 14. Internal to interim chamber 38 is a slide member which couples the air track system 20 in entrance air lock 26 with the substrate holder 34; this is described and shown more clearly in FIG. 2A.

In operation, the series of slices 18 are transported along air track 20 to work station 12. At least one or more manufacturing steps is performed at atmospheric pressure on these semiconductor slices 18 at work station 12. Upon completion of the manufacturing step on slices 18 at work station 12, computer 25 actuates a compressed air source and transports slices 18 along the air track system 20 until the slices reach entrance air lock 26.

Figure 3A:
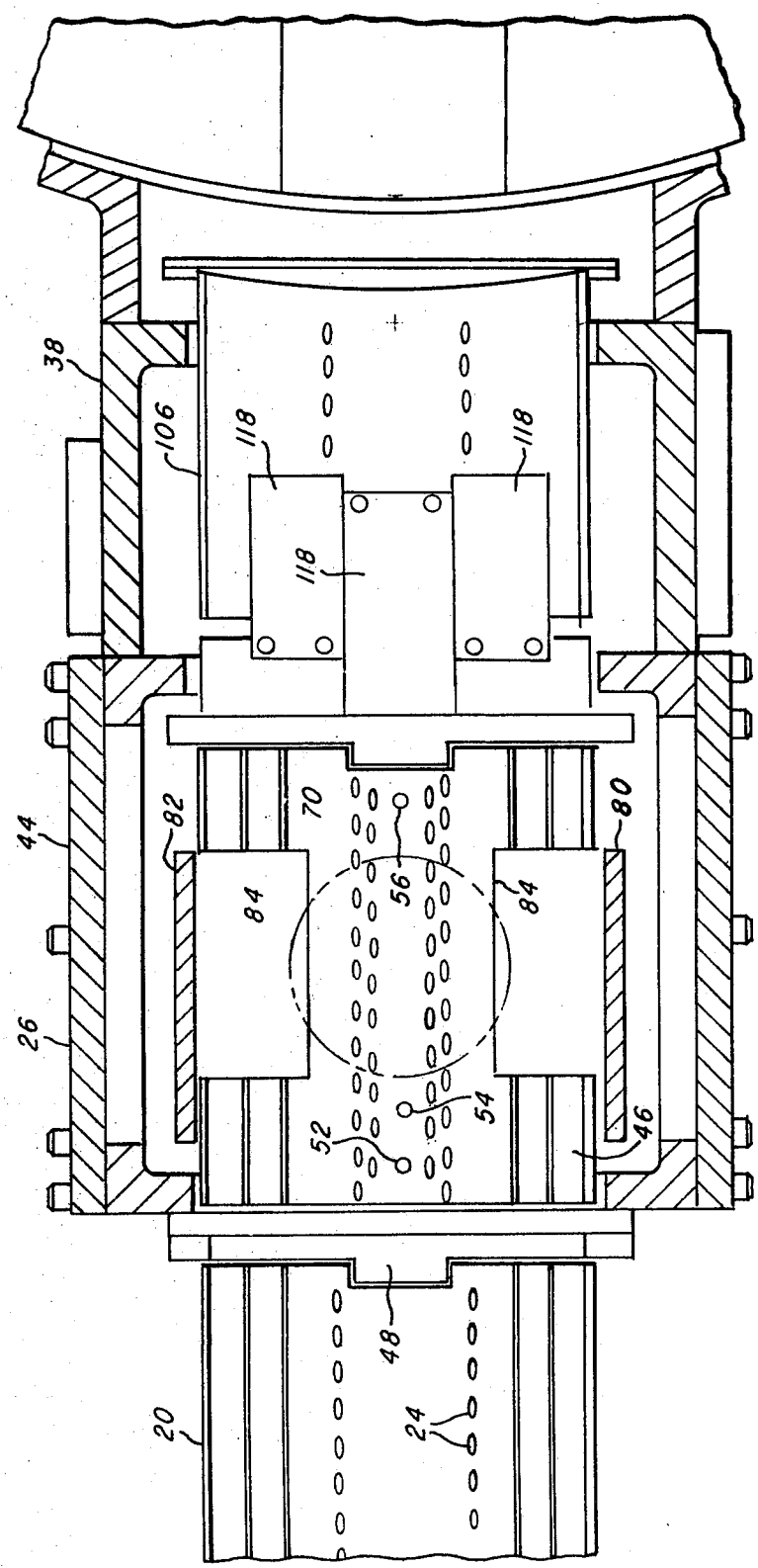
FIG. 3A is a plan view of the air lock and interim chamber with the magazine loader excluded and the slidable air track in the retracted position.

FIG. 2A shows a cutaway perspective view of the entrance air lock 26. Air lock 26 is composed of two sections, a top housing 42 and a bottom housing 44 which are hinged together. The entrance air lock serves two functions: (1) it serves to store a plurality of work pieces (for example, entrance air lock will hold 21 semiconductor slices) and (2) air lock 26 may be evacuated to a pressure which will match that of plasma reactor work station 14 (shown in FIG. 1). Referring to FIG. 3A entrance air lock 26 has an additional section of air track 46 which is parallel to and in line with the air track 20 outside of air lock 26. An entrance gate 48 is initially in the open position to allow slices 18 to pass through an entrance aperture 50 (FIGS. 2A and 2C) in the front of the bottom housing 44. In the open position, the top of entrance gate 48 is flush with the top of the air track system to allow the slices to pass thereover. Inside the entrance air lock, there are three capacitive sensors, 52, 52 and 56 (FIG. 3A), located on the surface of the air track system. As mentioned earlier, a compressed air source 58 supplies compressed air to the air track system 20 and apertures 24 to transport slices 18 between manufacturing stations. However, nitrogen source 60 supplies compressed nitrogen via line 62 to operate the air track system 46 within entrance air lock 26. When entrance gate 48 is open, purge valve 64 is open (thereby removing the vacuum) and valve 66 is closed so that a slightly positive pressure of nitrogen is supplied the inner chamber of entrance air lock 26 via supply line 68. With nitrogen filling the inner chamber of air lock 26, a "curtain of nitrogen" covers entrance aperture 50, thereby preventing impurities from entering the chamber and maintaining an ultraclean condition. As slice 18 moves from the external air track 20 into the input air lock 26, the compressed air in the external air track system 20 is applied continuously. However, as slice 18 reaches capacitve detector 52, the air track is disengaged from its continuous operation by computer 25 which senses the detector status. Computer 25 energizes the nitrogen source to provide a series of pulses of nitrogen gas to the air track system 46 in air lock 26 to position the slice over capacitive detector 54 and between the capacitive detectors 52 and 56, the preferred loading position. During the loading process, exit gate 70 is in the closed or up position. This isolates the pressure in plasma reactor 14 and interim chamber 38 from the atmospheric pressure in entrance air lock 26.

Referring again to FIG. 2A, magazine loader 72 allows a plurality of slices 74 to be loaded into the entrance air lock 26. Slice magazine holder 76 is comprised of two opposed rows of slots or channels 77 in which the edges of slices 74 are positioned by the air track. The sides 78 of loader 72 surround air track 46 (see FIGS. 2A and 3B) and fit into elongated holes 80 located in support plate 82. Air track 46 is indented at 84 in order to accomodate sides 78 of magazine loader 72. A drive shaft 86 passes through support member 82 and is connected to drive shaft motor 88. As the magazine loader 72 is loaded with slices, support member 82 is driven upwards by drive shaft 86 and motor 88 through elevation screw nut 90 (see FIG. 2B). Support plate 82 is moved through two guide bars 92 which have affixed thereto upper stop limits 94 and lower stop limits 96 to limit the motion of support plate 82 during the loading and unloading cycle of magazine loader 72.

In operation, the external air track 20 as well as the additional air track 46 (FIG. 3A) in entrance air lock 26 operate to load magazine loader 72. As each position in the magazine loader is filled, motor 88 (FIG. 2A) is actuated and drives the support plate 82 and magazine loader 72 up one position. The air track is again actuated and an additional slice is loaded into magazine loader 72. This process is continued until all of the slices 74 to be processed are positioned in magazine loader 72.

When magazine loader 72 is filled, solenoid valve 98 is actuated through linkage 100, thereby moving the entrance gate and closing the entrance aperture 50 (FIG. 2C). Referring to FIG. 2A, valve 66 is opened and purge valve 64 is closed thereby connecting the vacuum pump 59 to the interior chamber of entrance air lock 26 chamber by way of line 68. The pressure in entrance air lock 26 is brought to a subatmospheric pressure which matches the subatmospheric pressure in plasma reactor work station 14 and interim chamber 38, for example 7.5 torr. When the two pressures are matched, solenoid valve 102 through linkage 104 opens exit gate 70 between the air lock 26 and the interim chamber 38. Valve 102 and exit gate 70 are only actuated and opened during the time period when reactor work station 14 is to be loaded with slices. FIGS. 2A and 3A show interim chamber 38 being comprised of a slide or movable air track 106 for transporting the plurality of slices 74 from chamber 26 to reactor work station 14. FIGS. 2A and 3A show slide 106 in the fully retracted position. In this position, slide 106 is completely enclosed in the housing of interim chamber 38. By actuating solenoid valve 108 (FIG. 2C) through linkage 110, slide 106 is moved to its fully extended position (also see FIG. 3B), passing through shield 112 (FIG. 2C). Slidable air track system 106 is composed of two parts, a stationary section 114 and a movable section 116 which is connected to linkage 110 (FIG. 2C). In the fully extended position, covers 118 cover the space remaining when movable portion 116 moves to its fully extended position. In this fully extended position shown in FIG. 2C, the slidable air track 106 is capable of transporting slices 74 from the magazine loader 72 into reactor work station 14. Shield 112 covers the opening between the inner chamber 38 and work station 14 when the movable air track 116 is in its retracted position (FIG. 2A). When movable air track 116 is extended, it pushes Shield 112 down to allow the track 116 to engage the substrate table 120. Shield 112 helps to prohibit gas from moving in and out of the chamber of station 14 and ensures a symmetrical atmosphere with no discontinuities for processing.

Figure 4:
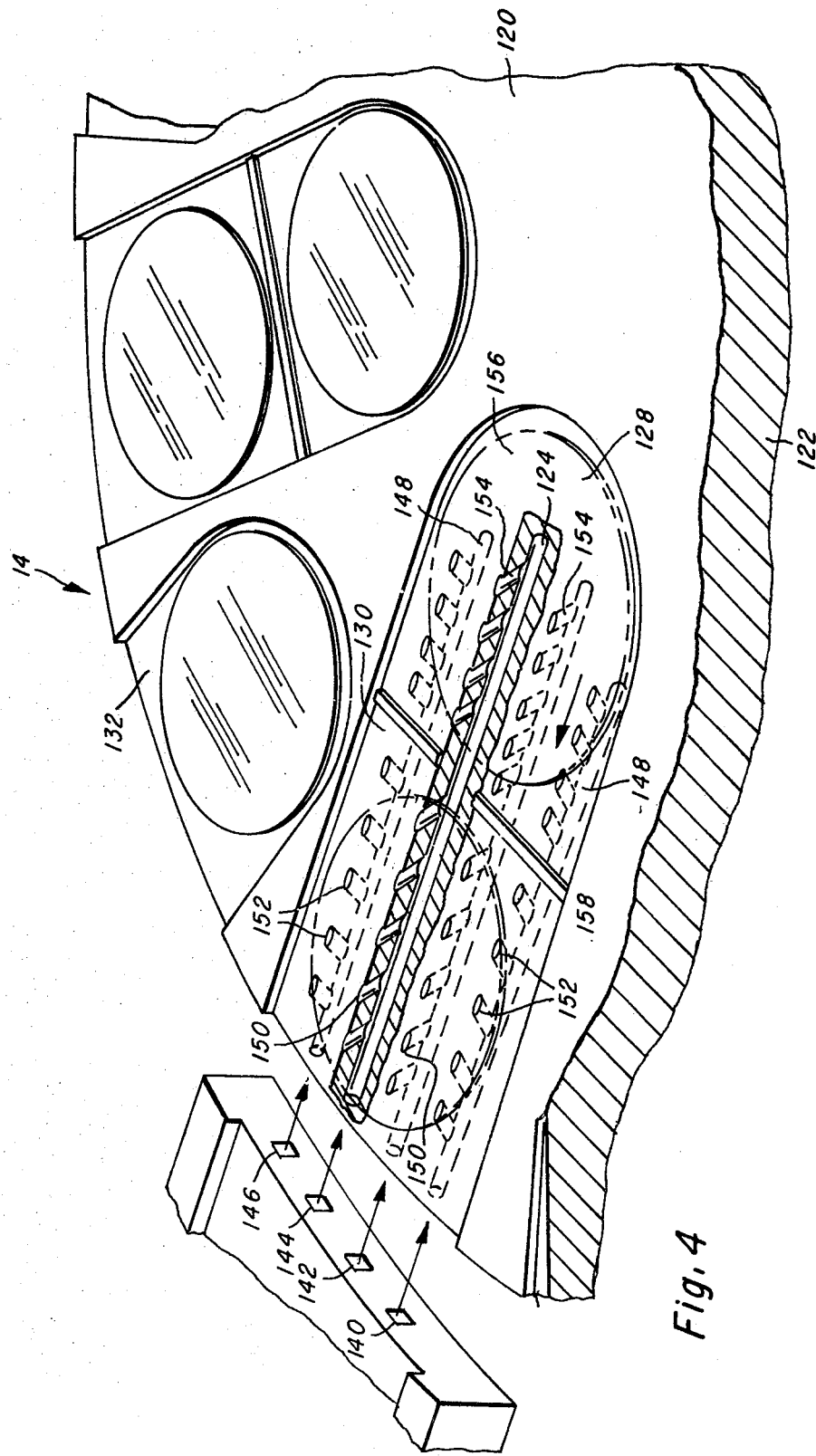
FIG. 4 is a cutaway perspective view of the air track and circular substrate holder table used in a manufacturing work station.

FIGS. 4 and 5 illustrate a more detailed view of the slice substrate holder or table 120 in reactor work station 14. The substrate table is comprised of three parts, a base section 122 (which has formed therein a plurality of double and single slice positions 130 and 132, respectively, having grooves or cavities 140a-146a therein), a spacer plate 134 having apertures 136a-d which overlie grooves 140a-146a, respectively, and a third plate 128 which has four pair of grooves 124a-124d and corresponding holes 148-152 extending therethrough for producing slice supporting and transporting jets when a gas is passed through such holes. The base section 122 is of a generally circular configuration.

A pressurized fluid (nitrogen) through cavity 140 (pictured as an arrow from cavity 140) forces nitrogen through groove 140a (FIG. 5), through spacer holes 136a, through grooves 124a and holes 148. Pressurized nitrogen through cavity 142 forces nitrogen through groove 142a, through spacer holes 136a, through grooves 124b and holes 150. Pressurized nitrogen through cavity 144 froces nitrogen through groove 144a, spacer holes 136c, grooves 124c and holes 152. Pressurized nitrogen through cavity 146 forces nitrogen through cavity 146a, spacer holes 136d, grooves 124d and holes 154.

Therefore, to transport a slice to the inner position of the substrate holder 120 requires pressurized nitrogen to be applied to cavities 144 and 140 which would produce air jets from holes 152 and 148; this causes a slice to be transported to the position shown by slice 156 (FIG. 4). By applying pressurized nitrogen to cavity 144 only, an air jet will flow through holes 152 only, thereby transporting slice 158 to the position shown in FIG. 4. Two independent sets of light sources are located in the upper portion 30 (FIG. 1) of plasma reactor work station 14 and two corresponding sets of detectors are located below the substrate base 122. One set of sources and corresponding detectors is used when loading slices into the reactor system while the other set of sources and corresponding detectors is used when unloading the slices.

FIG. 5 illustrates light sources 160a-d and sensors 162a-d. When the slices 74 in air lock 26 are to be transferred to the substrate holder, nitrogen is initially applied to the air track system continuously until the slice interrupts the first light beams produced by light source 160a on the substrate table (FIG. 5). If the slice is to be loaded only in the outer substrate holder position (i.e., where slice 158 in FIG. 4 is positioned), the slice will stop at the locations of first sensor 162a and then the air track system will be pulsed intermittently with nitrogen until slice 158 no longer covers hole 170, thereby allowing light source 160a to impinge on detector 162a. When light from source 160A and 160C impinges upon detectors 162a and 162c and the light from source 160b is blocked by the slice from impinging upon detector 162b, then the slice is correctly positioned in the outer slice position. If the slice is to be transported to the inner slice position, then it is transported continuously until it covers holes 174 (and interrupts the light from source 160c). The air track system is then pulsed until the slice no longer covers hole 174 but covers hole 176, thereby allowing the light from source 160c to impinge on detector 162c and prevent light from source 160d from impinging on detector 162d. This condition assures proper placement of the slice in the inner slice position (where slice 156 is located in FIG. 4). Accordingly, pulsing of the air track system allows controlled placement and positioning of the slice.

The magazine loader 72 in air lock 26 (FIG. 2A) is successively lowered by motor 88 during the unloading procedure such that each successive slice engages the air track system for transport to the next substrate holder location. The substrate table 120 is sequentially rotated by motor 36 (FIG. 1) until each location in the substrate table is filled or the magazine loader 72 is empty. When the air lock 26 is emptied, exit gate solenoid valve 102 (FIG. 2C) is actuated through linkage 104 and the exit gate is closed. Additionally, valve 108 and linkage 110 (FIG. 2C) are actuated in order to move the slide member 106 back to its retracted position shown in FIG. 2A. Processing of the slices may then occur or the pressure may be reduced still further before the manufacturing steps are carried out. Some semiconductor processing steps require that the chamber in the plasma reactor 14 be less than 1 torr, for example, 0.7 torr.

Referring again to FIG. 1, after the processing step or steps have been completed in plasma reactor work station 14, the reverse process occurs to unload the slices through exit interim chamber 40 and exit air lock 28. Structurally, the entrance air lock 26 is essentially the same as exit air lock 28 and chamber 38 is essentially the same as interim exit chamber 40. One obvious difference would be that holes 24 located on the air track will be inclined at an angle and direction such as to support and transport the slices out of the plasma reactor 14. Nitrogen passing through holes 150 and 154 (FIG. 4) will support and transport the slices out of the plasma reactor 14. The entrance gate of the exit air lock is closed and the chamber pressure of the exit air lock 28 is brought to the same pressure as that of reactor work station 14, for example 7.5 torr. It has been experimentally determined that pressures of approximately 1.0 to 7.5 torr can be utilized during the loading and unloading cycle in that with pressures lower than that, it is difficult to control the movement of the slices and pulses of gas applied to the air track system cause overshoot and loss of control of the slices.

This pressure is dependent upon physical factors such as diameter of the holes, gas flow rates, pulse duration, etc. and can be modified as required. Once the pressure in exit air lock 28 matches that of the plasma reactor 14, the exit gate of the exit air lock opens, the movable slide is extended to the substrate holder and the slices are unloaded one at a time. As the magazine loader is loaded in the exit air lock, the magazine rises until the substrate table is unloaded. Upon completion of the loading process of the exit air lock, the exit gate is closed, the slidable air track is retracted and the interior of exit air lock 28 is then brought to atmospheric pressure. A high purity nitrogen atmosphere is utilized in the exit airlock in order to maintain ultraclean conditions. Upon reaching atmospheric pressure, the entrance gate is opened and the air track system removes the slices one at a time from the exit air lock. As each slice is unloaded, the magazine loader is successively lowered until it is empty.

Although the present invention has been shown and illustrated in terms of a specific method and apparatus, it will be apparent that changes or modifications can be made without departing from the spirit and scope of the invention as defined by the appended claims.

What is claimed is:

1. A line for manufacturing an article comprising:
   a plurality of work stations, each of said work stations performs at least one manufacturing operation and at least one of said plurality of stations operates at subatmospheric pressures,
   storage means operatively connected to said subatmospheric work station for loading and unloading articles therefrom at atmospheric and subatmospheric pressures, and
   pressurized gas transport means for transporting said article at subatmospheric pressures between said storage means and said subatmospheric work station.

2. A manufacturing line according to claim 1 wherein said gas transport means comprises a guideway and floor member between said guideway and means positioned along a line in said floor member for directing a plurality of article supporting and propelling gas jets through said floor member.

3. A manufacturing line according to claim 2 wherein said means positioned along a line comprises a plurality of slanted holes.

4. A manufacturing line according to claim 1 wherein said article is a semiconductor slice.

5. A manufacturing line according to claim 1 wherein said storage means comprises an air lock system having entrance and exit gate for loading and unloading said article.

6. A manufacturing line according to claim 5 wherein said air lock further includes:
   a gas track system passing through said entrance and exit gate for transporting said articles into and out of said air lock, and
   article loading means operatively associated with said gas track to allow a plurality of articles to be loaded and unloaded therefrom.

7. A manufacturing line according to claim 6 wherein said loading means comprises a pair of walls on opposite sides of said gas track,
   means attached to said walls for loading a plurality of articles, and
   drive means for raising and lowering said article loading means as such article loading means is loaded and unloaded.

8. A line according to claim 6 wherein said means attached to said walls comprises structure having a plurality of slots therein.

9. A system for loading and unloading a workpiece at subatmospheric pressures, comprising:
   (a) a housing having first and second gates,
   (b) means for opening and closing said gates,
   (c) pressurized gas transfer means for transporting on supporting and propelling jets of gas said workpiece into and out of said first and second gates,
   (d) magazine loader means inside said housing and partially surrounding said gas transfer means for storing said workpiece,
   and (e) means connected to said housing for reducing the pressure therein to a predetermined subatmospheric pressure.

10. A system according to claim 9 wherein said magazine loader means is operatively coupled to a power source which moves said magazine loader means as the workpieces are loaded and unloaded.

11. A system according to claim 10 wherein said magazine loader means is raised and lowered.

12. A system according to claim 11 further comprising a support plate forming a base for the magazine loader means and a drive shaft coupled to said plate for moving said magazine loader means.

13. A system according to claim 9 wherein said gas transfer means comprises an elongated floor and guide members positioned on opposite sides of said floor.

14. A system according to claim 13 further including sensors in said floor for ensuring accurate placement of said workpieces thereon in order to load said workpieces in said magazine loader means.

15. A system according to claim 9 wherein said gas transfer means provides impulses of gas in order to accurately transport and stop said workpieces.

16. A system according to claim 9 wherein said magazine loader means includes slots for storing the workpiece.

17. A system according to claim 9 wherein said gas transfer means includes a slidable section for engaging and disengaging the work station.

18. A workpiece handling and transporting system for operation at a subatmospheric pressure comprising:
a work station which performs a manufacturing operation on a workpiece at a subatmospheric pressure,
storage means operatively associated with said work station for storing said workpiece at said subatmospheric pressure, and
pressurized gas transport means for moving said workpiece at subatmospheric pressures between said storage means and said work station.

19. A workpiece handling and transporting system according to claim 18 wherein said gas transport means comprises means for directing a plurality of workpiece supporting and propelling jets of gas under pressure.

20. A workpiece handling and transporting system according to claim 19 wherein said means for directing supplies impulses of gas under pressure.

21. A workpiece handling and transporting system according to claim 19 wherein said gas transport means further includes a slidable section which extends to said work station from said storage means for transporting said workpiece between said storage means and said work station.

22. A workpiece handling and transporting system according to claim 18 wherein said storage means comprises an air lock system for receiving said workpiece and means for increasing and decreasing the pressure in said air lock between said subatmospheric pressure and atmospheric pressure.

23. A workpiece handling and transporting system according to claim 18 further including:
second storage means coupled to said work station for receiving at said subatmospheric pressure the workpiece after said manufacturing operation is completed, and
second gas transport means for moving said completed workpiece between said work station and said second storage means.

24. A method for handling and transporting a workpiece to a manufacturing work station at a subatmospheric pressure comprising the steps of:
loading a workpiece into a storage means at atmospheric pressure,
reducing the pressure of said storage means to a predetermined subatmospheric pressure, and
transporting on a pressurized gas transport system said workpiece at subatmospheric pressure between said storage means and a manufacturing work station evacuated to said predetermined subatmospheric pressure.

25. A method for handling and transporting a workpiece in a manufacturing work station at subatmospheric pressure according to claim 24 further comprising the steps of:
completing at least one manufacturing step on said work piece in said station, and
transporting on a gas transfer system said completed workpiece at said subatmospheric pressure from said work station to a second storage means.

26. A method according to claim 25 further comprising the steps of:
isolating the chamber inside the second storage means from the work station pressure,
raising the pressure in said second storage means from said subatmospheric pressure to atmospheric pressure, and
unloading said workpiece from said second storage means.

27. A method according to claim 24 comprising periodically applying gas to each of the gas transfer systems in order to accurately position the workpiece.

28. A method for handling and transporting a workpiece to a manufacturing work station at a subatmospheric pressure comprising the steps of:
transporting a workpiece on a gas transport system to a storage means,
loading said workpiece in a workpiece loader in said storage means at atmospheric pressure,
indexing said loader to its next position and loading a second workpiece in said loader,
repeating steps (1) to (3) until loading is complete,
closing all apertures in said storage means and reducing the pressure of said storage means to a predetermined subatmospheric pressure,
opening a gate to form an aperture between the storage means and the work station, and
transporting through said aperture the workpieces from said storage means at said predetermined subatmospheric pressure on a gas pressurized transport system into said manufacturing work station operating at said predetermined subatmospheric pressure.

29. A method for unloading a workpiece from a manufacturing work station operating at a subatmospheric pressure, comprising the steps of:
(1) performing a manufacturing step on a workpiece at said subatmospheric pressure in the work station,
(2) transporting a workpiece on a gas pressurized transfer system between the work station at said subatmospheric work station and a storage means which is also at said subatmospheric pressure,
(3) isolating the pressure in said work station from that of said storage means,
(4) raising the pressure in said storage means,
(5) transporting the workpiece from the storage means.

* * * * *